United States

Helava

4,077,030

Feb. 28, 1978

[54] SENSOR DATA INPUT BY MEANS OF ANALOG TO PULSE WIDTH-TO DIGITAL CONVERTER

[75] Inventor: Uuno Vilho Helava, Southfield, Mich.

[73] Assignee: The Bendix Corporation, Southfield, Mich.

[21] Appl. No.: 659,386

[22] Filed: Feb. 19, 1976

[51] Int. Cl.² .................... H03K 13/20; G08C 15/06
[52] U.S. Cl. .................................. 340/183; 340/210; 179/170 J; 340/347 M; 340/347 AD
[58] Field of Search .... 340/347 AD, 347 M, 347 NT, 340/183, 210, 151; 179/170 J; 235/92 NG

[56] References Cited

U.S. PATENT DOCUMENTS

| | | | |
|---|---|---|---|
| 3,017,620 | 1/1962 | Abzug | 235/92 NG |
| 3,132,329 | 5/1964 | Penter | 340/183 |
| 3,587,092 | 6/1971 | Kelly et al. | 340/347 AD |
| 3,651,454 | 3/1972 | Venema et al. | 340/184 X |
| 3,678,512 | 7/1972 | Fergus | 340/151 X |
| 3,742,473 | 6/1973 | Hadden | 340/210 |

OTHER PUBLICATIONS

Hoeschele, Analog-To-Digital/Digital To Analog Conversion Techniques, J. Wiley & Sons, Inc., Aug. 1968, pp. 372-381.
The Engineering Staff of Analog Devices, Inc., Analog-Digital Conversion Handbook, Jun. 1972, pp. I-5 & 6, I-26 to I-33, I-107 & 108.

*Primary Examiner*—Thomas J. Sloyan
*Attorney, Agent, or Firm*—James R. Ignatowski; Russel C. Wells

[57] ABSTRACT

A system for transmitting data from remote sensors to a digital processing system is disclosed herein. The analog sensor output is converted to pulse width signals at the sensor location and converted from pulse width to digital data at the digital processor. Delay circuits at each sensor location permits the use of a single interrogation signal to simultaneously interrogate each sensor. The generation of the pulse width signal is delayed at each sensor location so that the pulse width signals from the sensors are serially received at the pulse width to digital converter. Only a single data transmission line is required for transmitting the interrogation signal and the pulse width signals back and forth between the digital processor and the sensor locations. In one embodiment, energy storage means are provided at each sensor location which provides sufficient electrical power for the operation of the sensor and the analog to pulse width converter. This energy storage means is charged by the interrogation signal transmitted along the single data transmission line eliminating the need for providing individual power leads at each sensor location.

29 Claims, 11 Drawing Figures

SENSOR DATA INPUT BY MEANS OF ANALOG TO PULSE WIDTH-TO DIGITAL CONVERTER

BACKGROUND OF THE INVENTION

1. Field of the Invention

The invention relates generally to analog-to-digital converter and data transmission circuits for digital processing systems and, in particular, to analog-to-pulse width-to-digital converter and data transmission circuits which use only a single bi-directional data transmission line between sensor locations and the utilization device.

2. Prior Art

One of the problems in the use of digital processors for high volume low cost control systems is the cost and complexity of equipment needed to enter sensor data into a computer. Two problems are associated with combining analog sensors and digital processors. These are: the conversion odf the analog output signals of the sensor into digital form and the transmission of data from a remote sensor to the computer. While data from the sensor to the computer may be transmitted in either analog or digital form, the transmission of data in analog form is prone to be noisy therefore special measures must be taken during transmission to avoid serious deterioration of the signal. In many instances these measures are costly and not always effective. The transmission of data in digital form not only requires an analog to digital (A/D) converter at each sensor location but also requires several data lines from each sensor to the computer. Alternatively a parallel to serial converter/transmitter may be included at each sensor location and the digital data serially transmitted to the digital processor. Neither analog nor digital transmission principles are well suited for an application requiring reliable, low cost equipment, such as for electronic control units having automotive or similar application. An alternative to either analog or digital transmission is the conversion of the analog signal to pulse width signals at the sensor locations and transmitting the pulse width signals to the digital processor where they are converted to digital form as taught by Chi Sun Lai in U.S. Pat. No. 3,801,834 (April 1974) or R. R. Unterberger in U.S. Pat. No. 2,968,022 (January, 1961). The transmitted pulse width signal is much less sensitive to the noise problems associated with analog data transmission and only requires a single transmission line between the sensor location and the computer.

In most applications the computer receives input data from several sensor sources. Normally, this data is received serially from the various sensors in response to interrogation signals as taught by Beck et al. in U.S. Pat. No. 3,059,228 (October 1962). The method taught by Beck et al., however, requires at least one extra lead to each sensor location for interrogation purposes. The requirement for the extra interrogation leads to each sensor location may be eliminated as taught by R. W. Fergus in U.S. Pat. No. 3,678,512 (July 1972). The telemonitoring system taught by Fergus uses a single bi-directional data transmission line for transmitting interrogation signals and data back and forth between the sensor locations and a digital processor. Each sensor location contains an analog to pulse width converter and a pulse counter which counts interrogation pulses on the bi-directional line and activates the analog to pulse width converter each time a predetermined number of pulses have been counted at each sensor location. The analog to pulse width converter extends the time duration of the interrogation pulse. This extended pulse signal is transmitted back to the digital processor via the bi-directional line. The Beck system also transmits a reset signal to the pulse counters at each sensor location. The reset signal has a polarity opposite the interrogation signal and sets the counter at each sensor location to zero printer to initiating the interrogation pulse sequence.

The disclosed system is an improvement over the prior art discussed above.

SUMMARY OF THE INVENTION

The objective of this invention is a low cost efficient solution to both the transmission and analog-to-digital conversion problems associated with the use of digital processors in control systems. The system embodies circuitry at each remote sensor location for converting the sensor's analog output signals into pulse width signals having pulse durations indicative of the sensor analog output signals. The pulse width signals are generated at the sensor locations in response to a single interrogation generated by the digital processor. The interrogation and pulse width signals are transmitted back and forth between the digital processor and the remote sensor locations via a single bi-directional line. At the digital processor the pulse width signal activates a gating circuit which gates high frequency clock signal to a binary counter which generates digital data corresponding of the length of the pulse width signal and indicative of the value of the analog sensor signal. Delay circuitry embodied in each pulse width signal generator delays the generation of the pulse width signals at each sensor location for predetermined periods of time after receiving an interrogation signal permits a plurality of sensors and associated pulse width signal generating circuits to interface the single bi-directional data transmission line. The delay period preceding the generation of the pulse width signal at each sensor location is different so that the pulse signals transmitted to the digital processor are received in a predetermined sequential order. The circuitry at each sensor location may also include a power storage means charged by the interrogation signal transmitted along the bi-directional communication line thereby eliminating the need for separate electrical power lines to each sensor location. The power storage means has sufficient electrical power storage capabilities to power the pulse width generation circuit for the generation of at least one pulse width signal at the particular sensor location.

Another objective of the invention is a system for transmitting data from a remote sensor to a digital processor using binary signals for both interrogation and data transmission on a single bi-directional communication line. Another objective of the invention is a system for transmitting data from a remote sensor to a digital processor in which the power for operating the sensor and its associated analog-to-pulse conversion circuitry is also transmitted along the same single bi-directional communication line. These and other advantages will become apparent from the drawings and the following specification:

DETAILED DESCRIPTION OF THE PREFERRED EMBODIMENT

Figure 1:
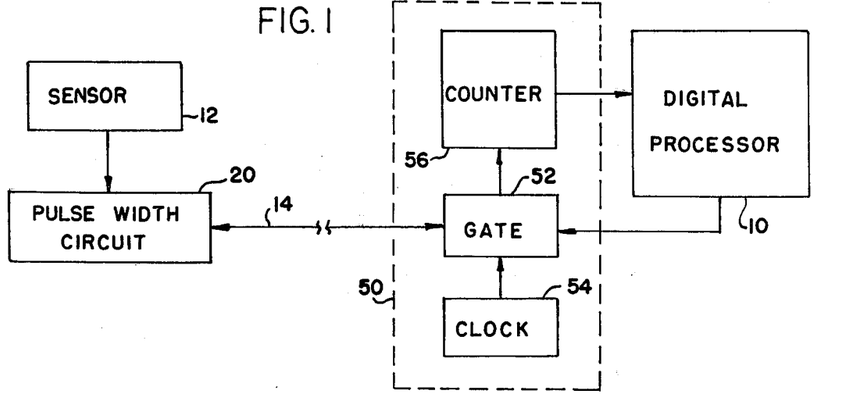
FIG. 1 is a block diagram of the disclosed data transmission system.

The block diagram of FIG. 1 illustrates the basic components of the disclosed system. A sensor 12 at a location displaced from a Digital Processor 10 generates an analog signal having a value indicative of a sensed condition. The analog signal is received by an associated Pulse Width Circuit 20 which responds to an interrogation signal generated by the Digital Processor and generates a pulse width signal having a pulse width (duration) indicative of the value of the analog signal. The pulse width signal is transmitted to a Digital Converter Circuit 50 by means of a Bi-Directional Data Transmission Line 14. The Digital Converter Circuit 50 responds to the pulse width signal and generates digital data indicative of the value of the analog signal. The digital data is transmitted to the Digital Processor 10 for subsequent processing. When the Digital Processor 10 is ready for new data, it generates an interrogation signal activating the Pulse Width Circuit 20 to generate another pulse width signal.

The Digital Converter Circuit 50 comprises a Gate 52, a Clock 54 and a Counter 56. The Clock 54 generates clock pulses at a predetermined high frequency and the generated clock pulses having pulse widths substantially shorter than the minimum pulse width signal capable of being generated by Pulse Width Circuit 20. The Gate Circuit 52 receives the interrogation signal generated by the Digital Processor 10, the data on the Bi-Directional Data Transmission Line 14 and the clock pulses from the Clock 54 and is operative to gate the interrogation signals to the Bi-Directional Data Transmission Line 14 and the clock pulses to the Counter 56 in response to only the pulse width signals. The Counter 56 receives the clock pulses generated during the interval the Gate 52 is enabled by the pulse width signals and generates digital data corresponding to the number of clock pulses received which in turn is indicative of the value of the analog signal generated by the Sensor 12.

Figure 2:
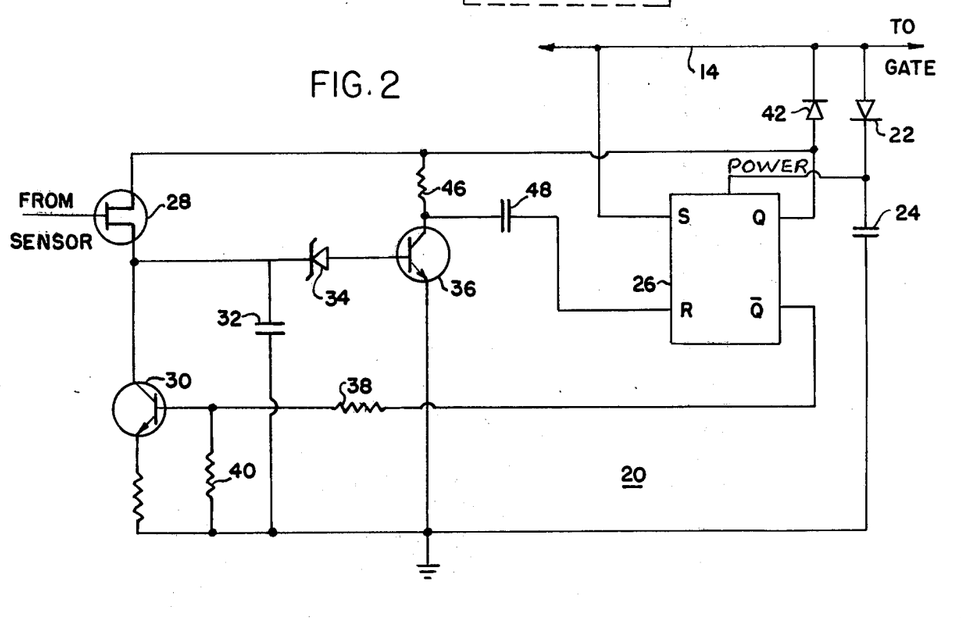
FIG. 2 is an electrical schematic of the pulse width generating circuit.

The details of the Pulse Width Circuit 20 are illustrated in FIG. 2. The interrogation signal from the Digital Processor 10 is transmitted from the Bi-Directional Line 14 to the "set" input of a Bistable Multivibrator 26. The interrogation signal triggers Multivibrator 26 to the set state which produces a signal at the output terminal designated "Q". The "Q" output terminal is connected back to the bi-directional line 14 through diode 42. The "Q" output terminal is also connected to the source electrode of FET Transistor 28. The Gate electrode of Transistor 28 is connected to the output of sensor 12 and receives an analog signal indicative of the sensed condition. The drain electrode of FET Transistor 28 is connected to the collector of Transistor 30, to Capacitor 32 and to the cathode of Zener Diode 34. The base of a Transistor 30 is connected to the complementary output terminal "Q" of the Multivibrator 26 through a resistance 38 and to ground through resistance 40. The opposite electrode of Capacitor 32 is connected to ground and the anode of Zener Diode 34 is connected to the base of Transistor 36. The collector of Transistor 36 is connected to the "Q" output of Multivibrator 26 through a resistance 46 and the emitter of Transistor 36 is connected to ground. The collector of Transistor 36 is also connected to the reset input of Multivibrator 26 via capacitor 48.

The operation of the pulse width circuit is as follows. Initially, Bistable Multivibrator 26 is assumed to be in the reset state and the "Q" output terminal is high having a positive potential. This positive potential applied to the base of Transistor 30 renders it conductive and discharges Capacitor 32 to ground potential. The trailing edge of the interrogation signal triggers Multivibrator 26 to the set state and a positive potential appears at the "Q" output terminal. This high potential is applied to the source electrode of FET Transistor 28 and to the collector Transistor 36 as well as applying power to the sensor 12 (not shown). With Multivibrator 26 in the set state, a low or ground signal appears at the "Q" output terminal which is now applied to the base of Transistor 30 through Resistance 38 and effectively blocks the conductance of Transistor 30. The analog signal from the Sensor 12 applied to the gate of the FET Transistor 28 causes it to conduct and charge the Capacitor 30 at a rate proportional to the value of the analog signal. When the potential on Capacitor 32 exceeds the breakdown potential of Zener Diode 34, current flows to the base of Transistor 36 rendering it conductive. In the conductive state, the potential at the collector of Transistor 36 switches to a ground potential which generates a signal via Capacitor 48 triggering Multivibrator 26 back to the reset state and terminating the high signal at the "Q" output terminal. A high signal again appears at the "Q" output terminal placing Transistor 30 in a conductive state and discharging Capacitor 32. Pulse Width Circuit 20 is now returned to its initial state awaiting a new interrogation signal. The pulse width signal is generated at the "Q" output of Multivibrator 26 in the set state and is transmitted to the Bi-Directional Line 14 via Diode 42.

One advantage of the pulse width circuit illustrated in FIG. 2 is that the operational power for this circuit may be provided via the Bi-Directional Line 14 by the interrogation signal generated by the Digital Processor 10. This may be accomplished by the incorporation of a Diode 22 and Storage Capacitor 24 to the circuit, as shown. When using this circuit arrangement, the interrogation signal generated by the Digital Processor 10 is a pulse signal having extended $t_1$, as shown on waveform 6-A. The Storage Capacitor 24 is charged through Diode 22 during the time interval of the interrogation pulse. In the intervening time period $t_2$ between interrogation pulses, the pulse width circuit is powered by electrical power stored in capacitor 24. In this arrangement Multivibrator 26 is triggered to the set state by the trailing edge of the interrogation pulse charging Storage Capacitor 24.

Figure 3:
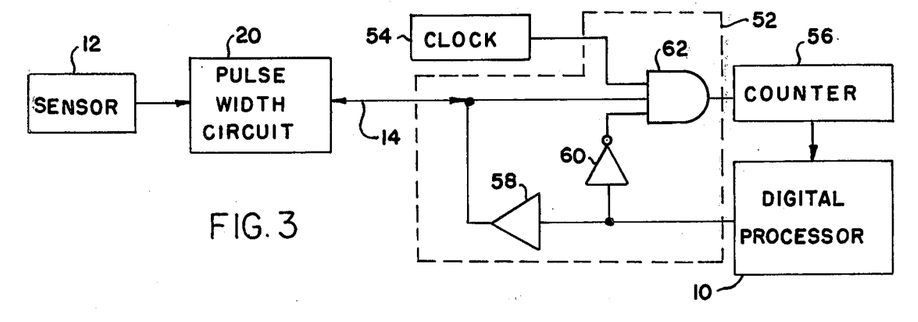
FIG. 3 is an electrical schematic of the gate circuit.
Figure 6:
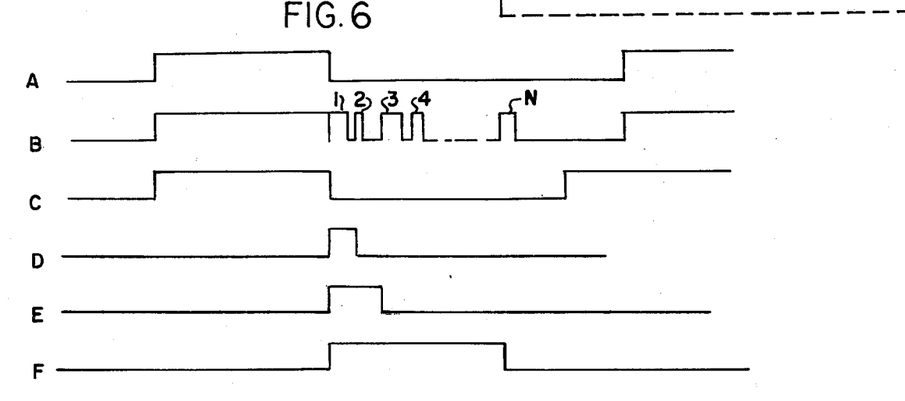
FIG. 6A is the wave form of the recharge interrogation signal.
FIG. 6B is a composite of the signals on the bi-directional communication line.
FIG. 6C is the output signal of the isolation monostable multivibrator.
FIG. 6D is the output signal from the delay multivibrator of the second sensor.
FIG. 6E is the output signal from the delay multivibrator of the third sensor.
FIG. 6F is the output signal from the delay multivibrator of the third sensor.

The details of the Digital Converter Circuit 50 are illustrated in the combined block diagram, circuit diagram of FIg. 3. The interrogation pulse shown on Curve A of FIG. 6 is generated by the Digital Processor 10 and is communicated to a Buffer 58 and an Inverter 60. The output of Inverter 60 is connected to one of the input gates of AND Gate 62. During the generation of the interrogation signal, Gate 62 is blocked by the complementary output signal of Inverter 60. The interrogation signal is transmitted to the Bi-Directional Line 14 through Buffer 58. When the interrogation signal provides electrical power to the Pulse Width Circuit 20 as discussed above Buffer 58 may be a drive amplifier which produces an interrogation signal having sufficient current capacity to charge the Storage Capacitor 24 in the Pulse Width Circuit 20.

When the interrogation signal is terminated, the output of Inverter 60 becomes a positive signal placing an enable signal at one input gate of Gate 62. The termination of the interrogation signal initiates the generation of the pulse width signal on Bi-Directional Line 14 as discussed with reference to FIg. 2. The pulse width signal enables the second input gate of AND Gate 62 which permits the clock pulse generated by Clock 54 to activate Counter 56. The number of clock pulses gated to the Counter 56 are determined by the duration pulse width signal and are indicative of the value of the analog signal generated by Sensor 12. Counter 56 responds to the number of clock pulses received generates digital data indicative of the value of the analog signal. This digital data is transmitted to the Digital Processor 10 for subsequent data processing.

Figure 4:
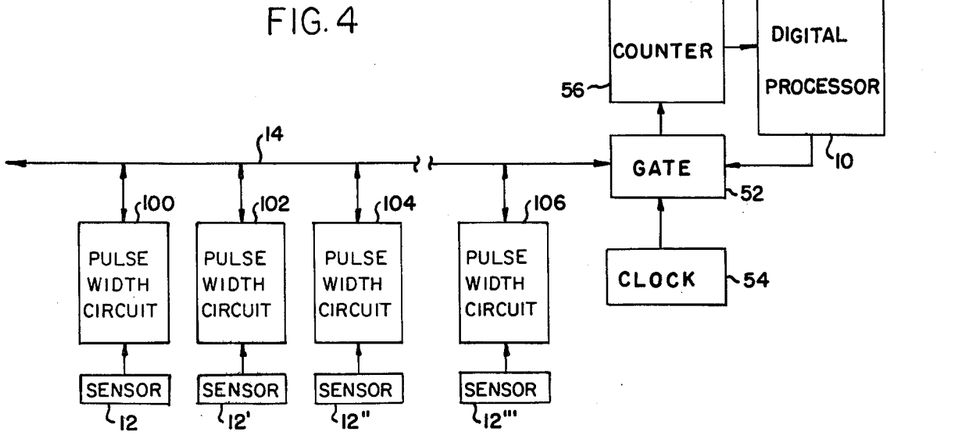
FIG. 4 is a block diagram of the disclosed system adapted to communicate with a plurality of sensors.

The embodiment illustrated in FIG. 4 shows a plurality of Sensors 12, 12′, 12″, 12‴ and companion Pulse Width Circuits 100, 102, 104 and 106 interfacing the single Bi-Directional Line 14 at various locations and in communication with the Digital Processor 10 through the Digital Converter 50. Although only four sensor and four companion pulse width circuits are shown, one skilled in the art will recognize that any number of sensors and companion pulse width circuits are possible. The Clock, 18 generates clock pulses the Counter 16 generates digital data in response to the number of clock pulses received, and Gate 52 performs the same functions as discussed with reference to the system shown on FIG. 3. The Pulse Width Circuit 100 transmits a pulse width signal indicative of the value of the analog signal produced by its associated Sensor 12 immediately after the termination of the interrogation signals, as discussed with reference to FIG. 2. The subsequent Pulse Width Circuits 102, 104 and 106 each contain a delay circuit which delays the generation of the pulse width signal generated by these circuits for a period of time which is slightly greater than the time it takes for the generation of previous pulse width signals.

Figure 5:
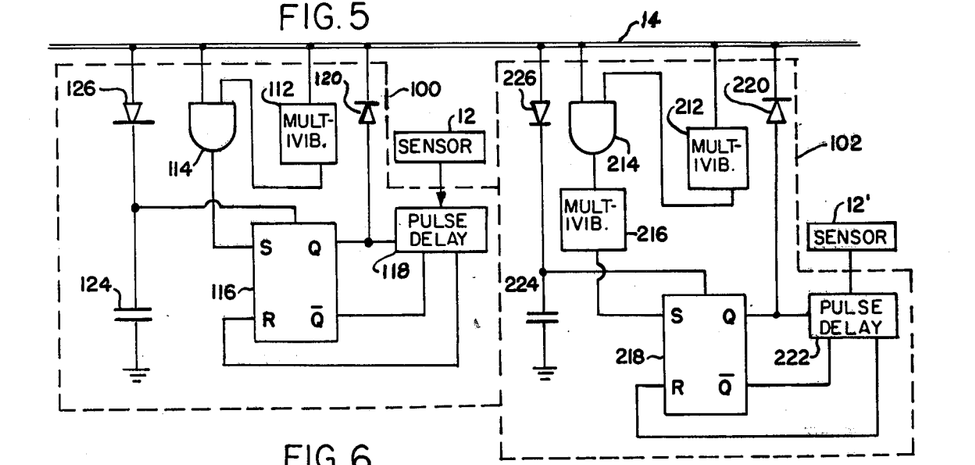
FIG. 5 is a circuit diagram of the delay circuits at each sensor in FIG. 4.

The details of Pulse Width Circuits 100 and 102 are illustrated in FIG. 5. The pulse interrogation signal charges Storage Capacitors 124 and 224 in the pulse width circuits 100 and 102 respectively via the bi-directional line 14 and Diodes 126 and 226. The charge on these two capacitors provides the electrical power for the pulse width circuits during the generation of the pulse width signals, as discussed with reference to FIG. 2. Referring first to the Pulse Width Circuit 100, Pulse Width Circuit 100 contains a Monostable Multivibrator 112 and an AND Gate 114. The Multivibrator 112 is triggered to its unstable state by the trailing edge of the interrogation signal and remains in its unstable state for a period of time $\Delta\tau_2$ between interrogation signals. The output signal from the Monostable Multivibrator 112 in its unstable state is a low or ground signal. AND Gate 114 receives the output signal from the Multivibrator 112 at one input gate and receives an input directly from the Bi-Directional Line 14 at the other input gate. The trailing edge of the interrogation pulse triggers the Multivibrator 112 to its unstable state placing a low signal at both gates of AND Gate 114 terminating the output signal from AND Gate 114 which triggers Bi-Stable Multivibrator 116 to its set state. The output of Multivibrator 116 in its set state is applied to a pulse forming pulse delay network 118 which produces a reset signal after a period of time indicative of the value of the analog received from Sensor 12. Pulse Width Circuit 118 may be a circuit of the type shown in FIG. 2 or any equivalent type of pulse width circuit known in the art. As long as the Multivibrator 116 remains in the set state, the high signal appearing at the "Q" output terminal is communicated back to the Bi-Directional Line 14 by means of Diode 120. The pulse width signal on the Bi-Directional Line 14, generated by Circuit 100, is illustrated as waveform B in FIG. 6 immediately following the interrogation pulse. The function of the Monostable Multivibrator 112 is to generate a low or ground signal which disables AND Gate 114 for a predetermined period of time so that the termination of pulse width signal generated by Circuit 100 or any subsequent pulse width circuit interfacing Bi-Directional Line 14 will not retrigger the Flip Flop 116.

Now referring to circuit 102 AND Gate 214 and Monostable Multivibrator 212 are connected directly to the Bi-Directional Line 14, as shown. The trailing edge of the interrogation pulse triggers a second Monostable Multivibrator 216 through AND Gate 214 in a manner similar to the way Multivibrator 112 AND Gate 114 trigger Multivibrator 116 in Circuit 100. The Multivibrator 216 remains as unstable for a period time which is slightly longer than the maximum period of a pulse width signal capable of being generated by Circuit 100. The output of Multivibrator 216 in its unstable state is a high or positive potential. At the termination of this period Multivibrtor 216 changes state and the output signal assumes a ground potential. The trailing edge of the output signal of Multivibrator 216 triggers Bistable Multivibrator 218 to its set state which produces a high signal on Bi-Directional Line 14 via Diode 220. The high signal on the "Q" output of Multivibrator 218 activates a Pulse Width Circuit 222 which produces a reset signal in response to analog signal from a sensor 12′. The reset signal generated by circuit 222 resets Multivibrator 218 to its initial state and terminates the pulse width signal communicated to Bi-Directional Line 14. Referring to FIG. 6, the waveform generated at the output of monostable Multivibrators 112 and 212 is shown as waveform C and a waveform at the output of Multivibrator 216 is shown as waveform D. The pulse width signal produced by Circuit 102 is shown as pulse 2 on waveform 6B. A subsequent Pulse Width Circuit 104 will have monostable multivibrator, such as Multivibrator 216 which has an unstable state which is longer by a suitable amount than the unstable state as the multivibrator in Pulse Width Circuit 102. Each subsequent pulse width circuit 106, etc. will have like multivibrators having progressively longer unstable states so that the pulse width signals produced by the individual pulse width circuits will be transmitted to the Bi-Directional line 14 at different times after the interrogation pulse in a predetermined sequence, as shown by pulses 3, 4 through N on waveform B. Waveforms E and F of FIG. 6 show the delay periods of the multivibrators in subsequent Pulse Width Circuits 104 and 106 respectively. Curve F represents the delay associated with the final pulse width circuit N in the series.

The sequential pulse width signals transmitted to Bi-Direction Line 14 from the individual pulse width circuits enables Gate 52 permitting Counter 56 to be activated by the clock pulses from Clock 54. The number of clock pulses counted by the Counter 56 during the period Gate 56 is enabled by each pulse width signal are converted to digital data indicative of the value of the analog signal generated at each individual sensor location. The digital data generated by Counter 56 is transmitted to Digital Processor 10 for subsequent processing.

Although the invention has been illustrated and described with reference to specific circuitry and components, it is recognized that one skilled in the art could use other components or conceive different circuit configurations to perform the same functions. Therefore, it is not intended that the scope of the invention be limited to the components and circuits illustrated and discussed in the specification.

What is claimed is:

1. A digital processing system comprising:
   digital processor means for generating output signals in response to digital input signals, said digital processor means further including means for generating interrogation signals in the form of a transition between a pair of signal levels which are significantly different;
   at least two sensor means disposed at remote locations for generating analog signals having a value indicative of sensed inputs;
   first pulse width converter means disposed at one of said remote locations and receiving analog signals from one of said sensor means for generating a first pulse width signal in response to each of said interrogation signals, said first pulse width signal formed by a transition between said same pair of signal levels and having a pulse width indicative of the value of the analog signal received from said one sensor means;
   second pulse width converter means disposed at the other remote locations and receiving analog signals from the other of said sensor means for generating second pulse width signal a predetermined time after the occurrence of each interrogation signal, said second pulse width signal formed by a transition between said same pair of signal levels and having a pulse width indicative of the value of the analog signal received from said other sensor means;
   digital converter means interfacing said digital processor and receiving the pulse width signals from said first and second pulse width converter means and said interrogation signals for generating digital data for said digital processor means, said digital data indicative of the pulse width of the received pulse width signals; and
   a single bi-directional data transmission line for transmitting said interrogation and said pulse width signals between said first and second pulse width converter means and said digital converter means;
   wherein said first and second pulse width converter means each comprises:
   bi-stable means switchable between two stable states for switching to a first state and generating a first signal having a signal level the same as one of said pair of signal levels in response to said interrogation signals and for switching to a second state and generating a second signal having a signal level the same as the other of said pair of signal levels in response to a reset signal, wherein said first signal is said pulse width signal;
   means enabled by said first signal and disabled by said second signal for integrating the analog signal generated by said sensor means to generate an integrated signal having a value proportional to the value of said analog signal and the time of integration;
   means enabled by said first signal for generating said reset signal each time said integrated signal exceeds a predetermined value; and
   pulse width signal isolation means interfacing said bi-directional data transmission line for isolating said bi-stable means from the signals on said bi-directional data transmission line for a predetermined interval after receiving said interrogation signal; and
   wherein said second pulse width converter means further includes:
   delay means for delaying for said predetermined time the switching of said bi-stable means to said first state in response to said interrogation signals.

2. The system of claim 1 wherein said first and second pulse width converter means further includes electrical power storage means storing electrical power during the transmission of said interrogation signals for providing electrical power to said first and second pulse width converter means for the generation of said pulse width signals and wherein said digital converter means further includes a driver amplifier increasing the electrical power of said interrogation signals to a value sufficient to fully charge said electrical power storage means.

3. The system of claim 1 wherein said digital converter means comprises:
   clock means for generating clock signals having pulse intervals substantially shorter than the minimum width of said pulse width signals;
   digital means for generating said digital data in response to said clock signals; said digital data indicative of the number of clock signals received; and
   control means for controlling the number of clock signals received by said digital means, said control means enabled in response to said pulse width signals to transmit said clock signals to said digital means and disabled by said interrogation signal blocking the transmission of said clock signals to said digital means.

4. The system of claim 3 wherein said at least two sensor means is a plurality of sensors and a like plurality of pulse width converter means wherein one of said plurality of pulse width converter means is a first pulse width converter means and the remaining pulse width converter means are second pulse width converter means wherein the delay means in each successive second pulse width converter means delays the switching of the associated bi-stable multivibrator means a time longer than the delay time of the delay means of the preceding pulse converter means so that the pulse width signals generated by successive pulse width converter means are generated in a predetermined sequential order and wherein each of said pulse width signal isolation means isolates said bi-stable multivibrator means from the signals on said bi-directional data transmission line for a time period sufficient to permit all of said plurality of pulse width converter means to complete the generation of said pulse width signal in said sequential order.

5. The system of claim 4 wherein each of said plurality of pulse width converter circuits includes electrical power storage means storing electrical power during the transmission of said interrogation signals for providing power for the generation of said binary pulse width signals to said first and second pulse width converter means and wherein said digital converter means further includes a power amplifier increasing the electrical power of said interrogation signals to a value sufficient to fully charge all of said electrical power storage means.

6. In combination with a digital processing system having at least two sensors disposed at remote locations generating analog signals in response to sensed inputs and a digital processor for generating output signals in response to digital input signals, said digital processor means further including means for generating interrogation signals indicative of a transition from a second signal level to a first signal level substantially different from said second signal level, an improved analog to digital data conversion and data transmission network comprising:

first pulse width generating means disposed at one of said remote locations and enabled by each of said interrogation signals for integrating the analog signals generated by one of said at least two sensors to generate a first pulse width signal having a pulse width equal to the time required for the integrated value of the received analog signals to reach a predetermined value, said first pulse width signal formed by a transition from said same second signal level to said same first signal level;

second pulse width generator means disposed at the other of said remote locations and enabled by said interrogation signals for integrating the analog signals generated by said other sensor to generate a predetermined time after the occurrence of each of said interrogation signals, a second pulse width signal having a pulse width equal to the time required for the integrated value of the received analog signals to reach a predetermined value, said second pulse width signals formed by a transition from said same second signal level to said same first signal level;

digital data generator means interfacing said digital processor means and receiving said pulse width signals from said first and second pulse width generator means and said interrogation signals for generating said digital data, said digital data indicative of the pulse width of said pulse width signals; and a single bi-directional data transmission line for transmitting said interrogation and pulse width signals between said first and second pulse width generator means and said digital data generator means;

wherein said first and second pulse width generator means each comprises:

bi-stable means switchable between two stable states for switching to a first state and generating a first signal having a signal level the same as said first signal level in response to said interrogation signals and for switching to a second state and generating a second signal having a signal level the same as said second signal level in response to a reset signal, wherein said first signal is said pulse width signal;

means enabled by said first signal and disabled by said second signal for integrating the analog signal generated by the sensors to generate an integrated signal having a value proportional to the value of said analog data and the time of integration;

means enabled by said first signal for generating said reset signal each time said integrated signal exceeds a predetermined value;

pulse width signal isolation means interfacing said bi-directional data transmission line for isolating said bi-stable means from the pulse width signals on said bi-directional data transmission line for a predetermined interval after said interrogation signal; and wherein said second pulse width generator means further includes delay means for delaying for said predetermined time the switching of said bi-stable means to said first state in response to said interrogation signals.

7. The combination of claim 6 wherein said first and second pulse width generator means further include electrical power storage means storing electrical power during the transmission of said interrogation signals for providing electrical power to said first and second pulse width converter means for the generation of said pulse width signals and wherein said digital data generator means further include a driver amplifier increasing the electrical power of said interrogation signals to a value sufficient to fully charge said electrical power storage means.

8. The combination of claim 6 wherein said digital data generator means comprises:

clock means for generating clock signals having pulse intervals substantially shorter than the minimum width of said pulse width signals;

digital means for generating said digital data in response to said clock signals, said digital data indicative of the number of said clock signals received; and control means for controlling the number of said clock signals received by said digital means, said control means enabled in response to said pulse width signals to transmit said clock signals to said digital means and disabled by said interrogation signal blocking the transmission of said clock signals to said digital means.

9. The combination of claim 8 wherein said control means comprises:

buffer means for transmitting said interrogation signals from said digital processor means to said bi-directional data transmission line;

means electrically disposed between said digital processor means and said buffer means for generating an inhibit signal in response to said interrogation signals;

means in circuit relationship with said clock means, said digital means, said means for generating said inhibit signal and said bi-directional data transmission line for transmitting said clock signals to said digital means in response to said pulse width signals and for blocking the transmission of said clock signals to said digital means during the occurrence of an interrogation signal in response to said inhibit signal.

10. The system of claim 9 wherein said pulse width signal isolation means comprises:

a first monostable multivibrator having a stable state generating a first output signal and switchable to an unstable state generating a second output signal in response to said interrogation signal, said first monostable mulivibrator remaining in said unstable state for a predetermined isolation period of time;

gate circuit means having a first input gate in circuit relationship with said bi-directional data transmission line, and a second input gate in circuit relationship with the output from said first monostable multivibrator for transmitting signals from said bi-directional data transmission line in response to the first signal generated by said first monostable mulivibrator and for blocking the signals from said bi-directional data transmission line in response to the second signal generated by said first monostable multivibrator; and wherein said delay means is a second monostable multivibrator having a stable state generating a first signal and an unstable state generating said delayed interrogation signal, said second monostable being switched to its second state in response to said interrogation signal transmitted by said gate means and remaining in said second state for said predetermined delay time.

11. The combination of claim 10 wherein said interrogation signals are pulse signals having a leading edge and a trailing edge, said first and second monostable multivibrators are switched to said unstable state by the trailing edge of said interrogation signals.

12. The combination of claim 11 wherein said digital processor generates said interrogation signals at predetermined time intervals, said first monostable multivibrator remains in said second state for a time period longer than said predetermined delay period plus the maximum duration of the pulse width signal generated by said one first conversion means and shorter than the predetermined time interval between said interrogation signals.

13. The combination of claim 12 wherein said at least two sensors comprises a plurality of sensors and a like plurality of pulse width generator means wherein one of said plurality of pulse width generator means is a first pulse width generator and the remaining pulse width generator means are said second pulse width generator means, wherein the delay means of each successive second pulse width generator means delays the switching of the associated bi-stable multivibrator for a time longer than the delay time of the delay means of the preceding pulse width generator means so that the pulse width signals generated by successive pulse width generator means are generated in a predetermined sequential order and wherein each of said pulse width signal isolation means isolates said bi-stable multivibrator means from the signals on said bi-directional data transmission line for a time period sufficient to permit all of said plurality of first converter means to complete the generation of said pulse width signal.

14. The combination of claim 13 wherein each of said first and second pulse width generator means further includes electrical power storage means receiving electrical power from said bi-directional data transmission line for providing power from the generation of said pulse width signals and wherein said digital data generator means further includes a power amplifier increasing the electrical power of said interrogation signals to a value sufficient to fully charge all of said electrical power storage means.

15. The system of claim 14 wherein each of said storage means comprises:

a diode having an anode connected to said bi-directional data transmission line and a cathode; and a storage capacitance having one electrode connected to the cathode of said diode and to said bi-stable multivibrator and having the other electrode connected to a ground potential.

16. An analog-to-pulse width-to-digital converter and data transmission circuit responsive to interrogation signals indicative of a transition between a pair of signal levels which are significantly different comprising:

first means enabled by each interrogation signal for converting analog signals generated by a first source to pulse width signals said pulse width signals having pulse widths indicative of the value of the received analog signals and formed by a transition between the same pair of signal levels as the interrogation signals;

at least one second means enabled by each interrogation signal for converting analog signals generated by at least one other source to pulse width signals a predetermined time after receiving said interrogation signal, said pulse width signals having pulse widths indicative of the value of the received analog signals and formed by a transition between the same pair of signal levels as the interrogation signals;

third means receiving said pulse width signals and said interrogation signals for generating digital data indicative of the pulse width of the pulse width signals generated by said first and said at least one second means; and a single bi-directional data transmission line for transmitting said interrogation and said pulse width signals between said first, second and third means; and wherein said first and said at least one second means each comprises:

bi-stable means switchable between two stable states for switching to a first state and generating a first signal having a signal level the same as one of said pair of signal levels in response to said interrogation signals and for switching to a second state and generating a second signal having a signal level the same as the other of said pair of signal levels in response to a reset signal, wherein said first signal is said pulse width signal;

means enabled by said first signal and disabled by said second signal for integrating said analog signal to generate an integrated signal having a value proportional to the value of said analog data and the time of integration;

means enabled by said first signal for generating said reset signal each time said integrated signal exceeds a predetermined value;

pulse width signal isolation means interfacing said bi-directional data transmission line for isolating said bi-stable means from the pulse width signals generated on said bi-directional data transmission line for a predetermined time after receiving an interrogation signal; and wherein each of said at least one second means further includes:

a delay means for delaying for a predetermined period the switching of said bi-stable means to said first state in response to an interrogation signal.

17. The system of claim 16 wherein said first and at least one second means each further include electrical power storage means storing electrical power during the transmission of said interrogation signals for providing electrical power to said first and said at least one second means after the termination of said interrogation signal for the generation of said pulse width signals and wherein said second converter means further includes a driver amplifier increasing the electrical power of said interrogation signals to a value sufficient to fully charge said electrical power storage means.

18. The system of claim 16 wherein said third means comprises:
   clock means for generating clock signals having pulse intervals substantially shorter than the minimum width of said pulse width signals;
   digital means for generating said digital data in response to said clock signals, said digital data indicative of the number of said clock signals received; and
   control means for controlling the number of said clock signals received by said digital means, said control means enabled in response to said pulse width signals to transmit said clock signals to said digital means and disabled by said interrogation signal blocking the transmission of said clock signals to said digital means.

19. The system of claim 18 wherein said control means comprises:
   buffer means for transmitting said interrogation signals from said digital processor means to said bi-directional data transmission line;
   means electrically disposed between said digital processor means and said buffer means for generating an inhibit signal in response to said interrogation signals; and
   means in circuit relationship with said clock means, said digital means, said means for generating said inhibit signal and said bi-directional data transmission line for transmitting said clock signals to said digital means in response to said binary pulse width signals and for blocking the transmission of said clock signals to said digital means during the occurrence of an interrogation signal in response to said inhibit signal.

20. The system of claim 19 wherein said means for generating an inhibit signal is an inverter amplifier generating an inverted signal indicative of the binary complement of said interrogation signal; and
   said means for transmitting and blocking is an AND gate having an output terminal connected to said digital means, said AND gate receiving said clock signals at a first input gate, receiving said binary pulse width signals from said bi-directional data transmission line at a second input gate and receiving said inhibit signal at a third input gate.

21. The system of claim 20 wherein said first and said at least one second means each further includes electrical power storage means receiving electrical power from said bi-directional data transmission line for providing electrical power for the generation of said binary pulse signals, and said buffer means is a driver amplifier increasing the electrical power of said interrogation signals to a value sufficient to fully charge said electrical power storage means.

22. The system of claim 21 wherein said isolation means comprises:
   a first monostable multivibrator having a stable state generating a first output signal and switchable to an unstable state generating a second output signal in response to said interrogation signal, said first monostable multivibrator remaining in said unstable state for a predetermined isolation period of time;
   gate circuit means having a first input gate in circuit relationship with said bi-directional data transmission line, and a second input gate in circuit relationship with the output from said first monostable multivibrator for transmitting signals from said bi-directional data transmission line in response to the second signal generated by said first monostable multivibrator; and
   wherein said delay means is a second monostable multivibrator having a stable state generating a first signal and an unstable state generating said delayed interrogation signal, said second monostable being switched to its second state in response to said interrogation signal transmitted by said gate means and remaining in said second state for said predetermined delay time.

23. The system of claim 22 wherein said interrogation signal is a pulse signal having a leading edge and a trailing edge, said bi-stable multivibrator and said first and second monostable multivibrators are switched by the trailing edge of said interrogation signals.

24. The system of claim 23 wherein said digital processor generates said interrogation signals at predetermined time intervals, said first monostable multivibrator remains in said second state for a time period longer than said predetermined delay period plus the maximum duration of the binary pulse width signal generated by said first means and shorter than the predetermined time interval between said interrogation signals.

25. The system of claim 24 wherein said at least one second means is a plurality of second means receiving analog signals from a like plurality of other sensors wherein the delay means of each successive second means delays the switching of the associated bi-stable means for a time longer than the delay time of the preceding second means so that the pulse width signals generated by the first and second means occur in a predetermined sequential order; and
   wherein each of said pulse width signal isolation means isolates said bi-stable multivibrator means from the signals on said bi-directional data transmission line for a time period sufficient to permit said first and said plurality of second means to complete the generation of said binary pulse width signal.

26. The system of claim 25 wherein each of said first and second means includes electrical power storage means receiving electrical power from said bi-directional data transmission line for providing power for the generation of said pulse width signals and wherein said third means further includes a power amplifier increasing the electrical power of said interrogation signals to a value sufficient to fully charge all of said electrical power storage means.

27. The system of claim 26 wherein each of said storage means comprises:
   a diode having an anode connected to said bi-directional data transmission line and a cathode; and
   a storage capacitance having one electrode connected to the cathode of said diode and to said bi-stable multivibrator and having the other electrode connected to a ground potential.

28. A method for transmitting information from at least two remote sources of analog information to a digital processor and for converting said analog information to digital data comprising the steps of:

generating on a single bi-directional data transmission line interconnecting said remote sources with said digital processor interrogation signals in the form of a transition between a pair of signal levels which are substantially different;

enabling in response to each interrogation signal a first converter means in circuit relationship with said single bi-directional data transmission line to integrate the analog information generated by one of said at least two sources and generate a pulse width signal having a pulse width equal to the time required for said integrated analog information to reach a predetermind value, said pulse width signal being a transition between the same pair of signal levels as said interrogation signal;

enabling in response to each interrogation signal at least one second converter means in circuit relationship with said single bi-directional data transmission line to integrate the analog information generated by the other of said at least two sources and to generate after a predetermined period of time a pulse width signal having a pulse width equal to the time required for said integrated analog information to reach a predetermined value, said pulse width signal being a transition between the same pair of signal levels as said interrogation signal; and transmitting said pulse width signals to a digital converter means interfacing the digital processor by means of said single bi-directional data transmission line, said pulse width signals activating said digital converter means to generate digital data indicative of the value of said analog information wherein said digital data is transmitted from said converter means to said digital processor;

wherein said step of enabling said first and second converter means includes the steps of:

generating an isolation signal for a predetermined isolation time period after the termination of each interrogation signal; and activating an electronic gate between first and second converter means and said bi-directional transmission line in response to said isolation signal to electrically isolate the input of said first and second converter means from the signals on said bi-directional line for said predetermined isolation time period; and wherein said step of enabling said second converter means further includes the steps of:

activating a delay circuit in each of said second converter means in response to the termination of said interrogation signal to delay the generation of pulse width signals generated by successive second converter means for predetermined successively longer periods of time so that the pulse width signals successive generated by said first and said at least one second inverter means generate said pulse width in a sequential order.

29. The method of claim 28 wherein said step of generating interrogation signals includes the step of amplifying said interrogation signals to provide sufficient electrical power to power said first and said second converter means, and said steps of enabling said first and said second converter means includes the step of storing electrical power for the operation of said first and second converter means in an electrical power storage means during the generation of said interrogation signal.

* * * * *